(12) United States Patent
Tajima et al.

(10) Patent No.: US 6,784,979 B2
(45) Date of Patent: Aug. 31, 2004

(54) FULL-CONTACT TYPE EXPOSURE DEVICE

(75) Inventors: Tsunesou Tajima, Tokyo (JP); Isao Momii, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/443,408

(22) Filed: May 22, 2003

(65) Prior Publication Data

US 2003/0234919 A1 Dec. 25, 2003

(30) Foreign Application Priority Data

Jun. 21, 2002 (JP) ........................................ 2002-180710

(51) Int. Cl.[7] .............................................. G03B 27/02
(52) U.S. Cl. .......................................... 355/78; 355/87
(58) Field of Search ...................... 355/78, 81, 84–87, 355/91, 95, 53, 94, 99; 269/21

(56) References Cited

U.S. PATENT DOCUMENTS

| | | | | |
|---|---|---|---|---|
| 3,711,081 A | * | 1/1973 | Cachon | ........................ 269/21 |
| 4,888,488 A | * | 12/1989 | Miyake | ........................ 355/78 |
| 5,017,960 A | * | 5/1991 | Tuulse | ........................ 355/91 |
| 5,206,680 A | * | 4/1993 | Dillow | ........................ 355/91 |
| 6,459,474 B1 | * | 10/2002 | Okada | ........................ 355/78 |
| 2003/0016342 A1 | * | 1/2003 | Asami | ........................ 355/78 |

* cited by examiner

*Primary Examiner*—D. Rutledge
(74) *Attorney, Agent, or Firm*—Nields & Lemack

(57) ABSTRACT

Full-contact exposure device that allows high adherence of a photo mask with a board. Upon completion of prescribed processing, a controller controls a moving mechanism to move a platen upward, thereby moving the photo mask and a board closer, and to stop at a position where a sealed space is formed between the two. At the same time a controller starts vacuuming by controlling a vacuum pump. By this vacuum pressure in the space between the photo mask and the board becomes negative, and the photo mask bends downward with its center area sagging and contacting the board. The controller controls a cam drive mechanism to rotate cams while vacuuming, allowing the photo mask to gradually make contact with the board from the center area to its periphery while pushing out the air gradually from the center to the periphery, thereby completing full contact with the board.

9 Claims, 3 Drawing Sheets

FULL-CONTACT TYPE EXPOSURE DEVICE

BACKGROUND OF THE INVENTION

1. Field of the Invention

The invention relates to a full-contact type exposure device

2. Related Art

The photolithography method has been applied widely in various fields, wherein a prescribed pattern is photographically imprinted by an exposure device on the surface of a substrate coated with photosensitive materials such as the photo resist, thereafter the pattern is formed on the substrate by etching process. Printed circuit boards have also been fabricated by using an exposure device in recent years.

In this exposure device, in order to increase the adherence of a photo mask depicted with an original pattern picture to a board during exposure, a vacuum full-contact method, that establishes full contact by evacuating the gap between the two, is widely employed. An exposure device of this method is referred to as full-contact exposure device.

OBJECT OF THE INVENTION

However, it is difficult to establish a completely uniform full contact of the photo mask with the board. A problem has been a tendency of a slight air residue left in the center area of the board.

If an air exists between the photo mask and the board, a complete full contact of the photo mask with the board cannot be obtained, and thus the decreased resolution degrades the exposure accuracy because the exposure rays spread after passing through the photo mask before irradiating the board.

A method has been conventionally developed to pressure the photo mask from behind, thereby bending the photo mask when making contact with the board. However, this method may increase the adherence in the center area but has a shortcoming in degrading the adherence around the periphery.

A technique to improve the adherence in the periphery by making the photo mask large relative to the board has also been proposed, but there still have been problems such as cost increase and inefficiency in parts replacement operation due to the large-scale photo mask, and deterioration of adherence in the center portion because the photo mask may bend further below the board.

The objective of the invention is to resolve such problems of the conventional technology described above.

SUMMARY OF THE INVENTION

In order to achieve the objective mentioned above, a full-contact type exposure device of the invention comprises a photo mask depicted with a pattern to be exposed, contacting an exposure object for exposure; means for moving said photo mask and exposure object relatively closer to each other to allow full contact; position holding means for holding said photo mask at a first position where the photo mask partially contacts the exposure object, and for holding the photo mask at a second position where the photo mask entirely contacts the exposure object; means for sealing between said photo mask and the object to be exposed; and means for vacuuming between said photo mask and the object to be exposed.

In the above configuration, because the photo mask and the object are held in the first position partially contacting each other first and then they are held in the second position, it prevents air from being left in between the photo mask and the exposure object, therefore the adherence improves.

It is preferred to configure said first position and second position modifiable so as to be flexible in various conditions.

It is further preferred that said means for sealing seals between the photo mask and the exposure object at least in between the first position and the second position, and said means for vacuuming vacuums between the photo mask and the exposure object at least in between the first position and the second position, wherein the photo mask and the exposure object are partially contacted in said first position and then completely contacted in the second position by vacuuming between them.

DETAILED DESCRIPTION OF THE PREFERRED EMBODIMENTS

The invention will now be described in reference to the attached drawings.

Figure 1:
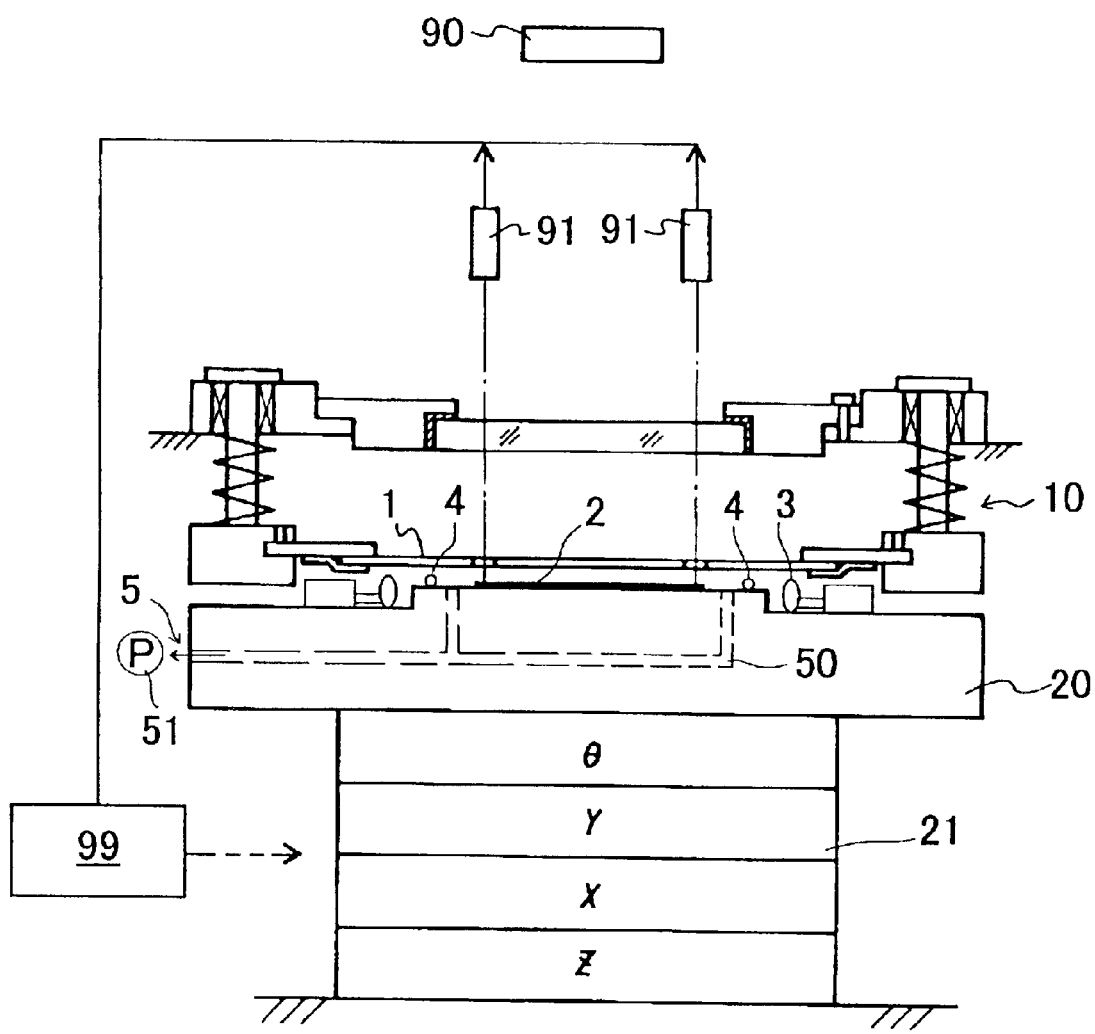
FIG. 1 is a schematic view of an embodiment of the invention.

FIG. 1 shows a full-contact type exposure device for fabricating printed circuit boards, wherein a board 2 (i.e., an exposure object) applied with photo resist is loaded on a platen 20 and made movable in the XYZ and θ directions by an moving mechanism 21.

A photo mask 1 depicted with a circuit pattern is supported above and facing the board 2 by a photo mask support device 10. The board 2 is moved closer to the photo mask 1, between the photo mask 1 and the board 2 is vacuumed to be contacted, and the circuit pattern of the photo mask 1 is imprinted on the board 2 by the exposure rays from an exposure light source 90.

The photo mask 1 is a glass mask in this embodiment, on which a circuit pattern may be directly depicted or a film mask depicted with a circuit pattern is adhered.

Further, a CCD camera 91 is used for position alignment of the photo mask 1 with the board 2.

Also, a controller 99 controls the entire device.

Further, the photo mask support device 10 may be moved instead of the platen 20, or even both of them may be configured to be movable.

A seal 4 is installed in the periphery of where the board 2 is loaded on the platen 20. This seal 4 comprises a packing 40 surrounding the board 2 to seal the space between the photo mask 1 and the board 2.

The sealed space is vacuumed by a vacuum device 5 having vacuum paths 50 and a vacuum pump 51.

The vacuum paths 50 are formed in the platen 20 and have their openings in the space sealed by the packing 40. The space is vacuumed by the vacuum pump 51 connected to the paths 50.

On the outside periphery of the board 2 are further installed a plurality of holding devices 3. The holding devices 3 supports the photo mask 1 for adjusting the position between the photo mask 1 and the board 2. They first hold the photo mask 1 and the board 2 in the first position where they partially contact each other, then position the photo mask 1 and the board 2 in the second position where the photo mask 1 and the board 2 make full contact.

Figure 2:
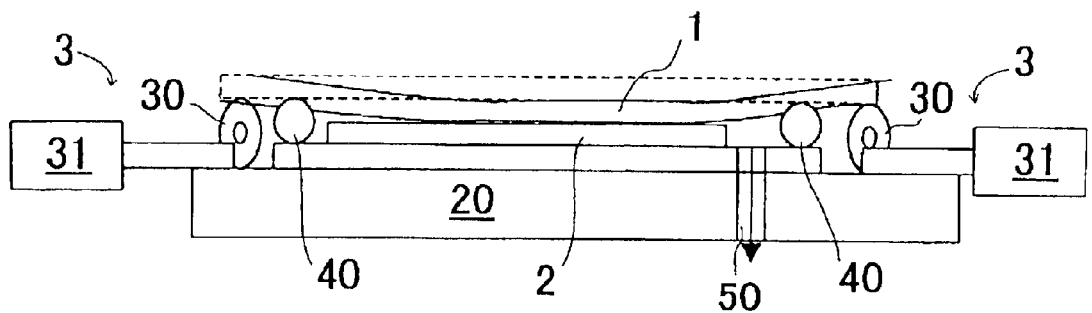
FIG. 2 is an explanatory diagram showing the functionality of the embodiment of the invention.

FIG. 2 shows the detail of the holding devices 3.

Figure 3:
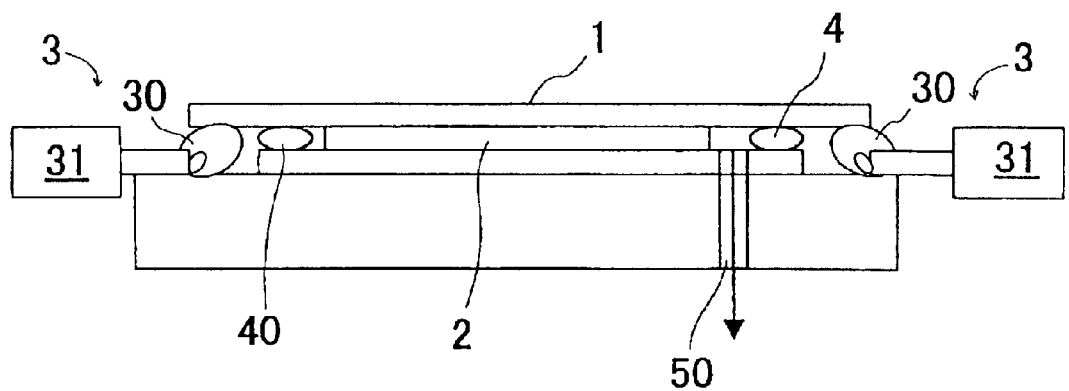
FIG. 3 is an explanatory diagram showing the functionality of the embodiment of the invention.

The holding devices 3 comprise a cams 30 and a cam drive mechanism 31, and are configured to position the photo mask 1 in the first position and the second position by rotating the cams 30. The cam drive mechanism 31 is controlled by the controller 99, and rotates the cams 30 to the first position as shown in FIG. 2, and to the second position as shown in FIG. 3.

FIG. 2 shows a state in which the center area of the photo mask 1 is making contact with the board 2, wherein the cams 30 support the photo mask 1 in this state.

The space between the photo mask 1 and the board 2 is sealed by the packing 40, forming a sealed space in this state.

The operation will now be described.

Upon completion of processing such as positioning, the controller 99 controls the moving mechanism 21 to move the platen 20 upward, to make the photo mask 1 and the board 2 closer, and to stop at a position where both make contact.

This state is shown in FIG. 2, wherein the holding devices 3 are set to the first position, namely, the cams 30 are set to the upper position.

After stopping the movement of the moving mechanism 21, the controller 99 starts vacuuming by controlling the vacuum pump 51. By this vacuuming the pressure in the space between the photo mask 1 and board 2 becomes negative pressure, and the photo mask 1 bends downward with its center area sagging and contacting the board 2.

At the same time the controller 99 controls the cam drive mechanism 31 to rotate the cams 30 to the second position, as shown in FIG. 3, while vacuuming.

As the state shifts from FIG. 2 to FIG. 3, the photo mask 1 makes contact with the board 2 gradually from the center to the periphery, slowly pushing the air outward from the center to the periphery. Because of it there is no air residue in between the photo mask 1 and the board 2. When the cams 30 complete their rotation, the photo mask 1 makes full contact with the board 2.

As soon as the photo mask 1 and the board 2 establish full contact, the exposure light source 90 irradiates exposure rays to imprint the circuit pattern of the photo mask 1 onto the board 2. Upon completion of the exposure, the process moves to next.

As described above, the photo mask 1 and the board 2 do not make contact just by the movement of the moving mechanism 21, but the photo mask 1 is held by the holding devices 3 such that only the center area contacts the board 2. From this state, the contact position is expanded from the center to the periphery by rotating the cams 30 while vacuuming the space between the photo mask 1 and the board 2 by the vacuum device 5, therefore the full contact is made while the air in between the photo mask 1 and the board 2 being expelled. Namely, no air residue in between the photo mask 1 and the board 2 allows proper full contact, and the exposure accuracy is improved.

Figure 4:
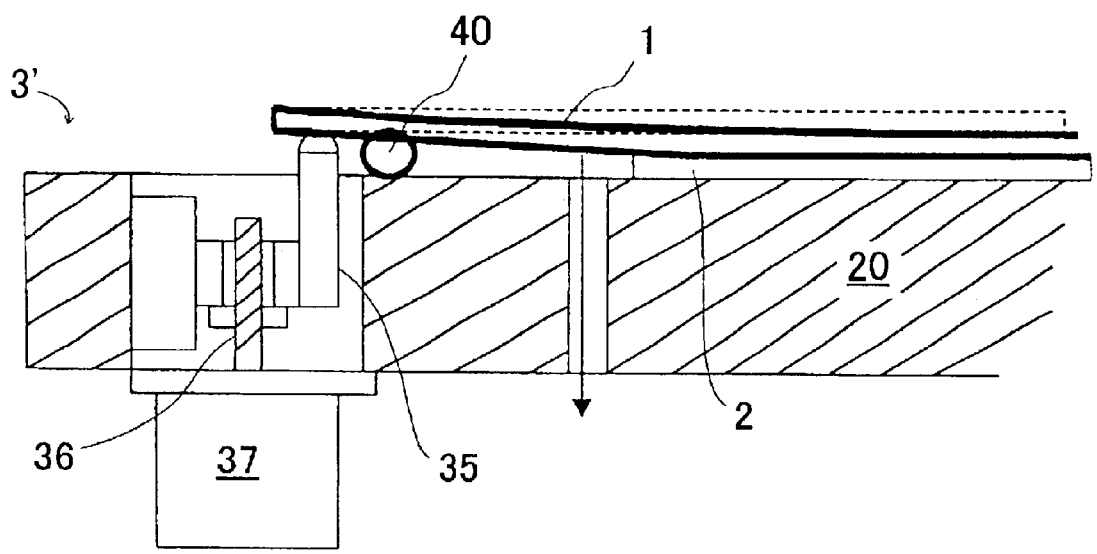
FIG. 4 is an expanded partial diagram showing another embodiment of the invention.

FIG. 4 shows another embodiment. In this embodiment a holding devices 3' includes a ball screw 36 and a pulse motor 37, wherein by rotating the pulse motor 37 the photo mask 1 is held in the first position and the second position.

In the case of this configuration, there is a benefit of the ability to easily adjust the first and the second positions by adjusting the rotation of the pulse motor 37.

Figure 5:
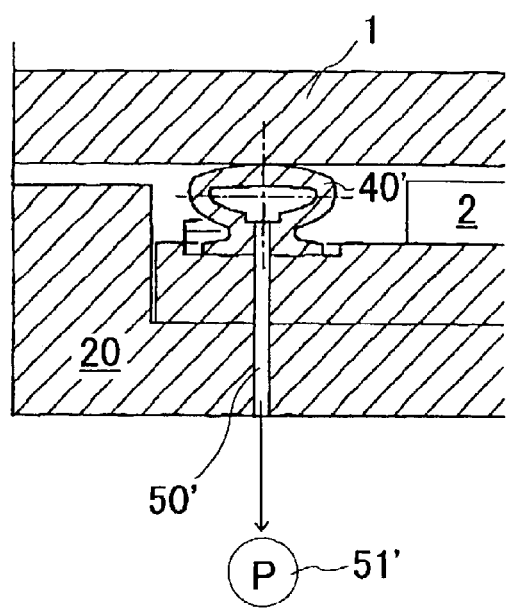
FIG. 5 is an expanded partial diagram showing yet another embodiment of the invention.

FIG. 5 shows an embodiment in which a packing 40' has a capability of the holding devices 3. The packing 40' has an internal hollow structure as shown in the figure, and is equipped with vacuum paths 50' connected to the internal space and a vacuum pump 51'. It is configured such that the photo mask 1 is held in the first position and the second position by this vacuum pump 51' controlling the pressure of the internal space of the packing 40' to expand or contract the packing 40'.

As described above, said full-contact type exposure device of the invention provides proper full contact between a photo mask and a board and thus there is a merit of improving the exposure accuracy.

What is claimed is:

1. A full-contact type exposure device comprising:

a photo mask depicted with a pattern to be exposed, which is exposed in contact with an exposure object;

means for relatively moving said photo mask and exposure object closer to allow contact;

holding means for holding a photo mask in a first position where said photo mask and exposure object make partial contact, and in a second position where said photo mask and exposure object make full contact;

means for sealing between said photo mask and said object to be exposed; and means for vacuuming between said photo mask and said object to be exposed.

2. The full-contact type exposure device of claim 1, wherein:

said first position is variable.

3. The full-contact type exposure device of claim 1, wherein:

said second position is variable.

4. The full-contact type exposure device of claim 1, wherein:

said means for sealing seals between the photo mask and the exposure object at least in between the first position and the second position; and said means for vacuuming vacuums between the photo mask and the exposure object at least in between the first position and the second position.

5. The full-contact type exposure device of claim 1, wherein:

said holding means have cams that can be rotated; and said cams at a predetermined rotation position holds the photo mask in said first position, and at another predetermined rotation position holds the photo mask in said second position.

6. The full-contact type exposure device of claim 1, wherein:

said holding means includes ball screws and a drive device for rotating the ball screws, and said holding means holds the photo mask in said first position and said second position by rotating the ball screws.

7. The full-contact type exposure device of claim 6, wherein:

said drive device for rotating said ball screws is a pulse motor.

8. A full-contact type exposure device comprising:

a photo mask depicted with a pattern to be exposed, which is exposed in contact with an exposure object;

means for relatively moving said photo mask and exposure object closer to allow contact;

means for holding the photo mask in the first position where said photo mask and exposure object make partial contact, and in the second position where said photo mask and exposure object make full contact, respectively, and for sealing between said photo mask and exposure object; and means for vacuuming between said photo mask and exposure object.

9. The full-contact type exposure device of claim 8, wherein:

said means for holding and sealing comprises;

a packing having an internal space, a pressure device for expanding and contracting said packing by adjusting the internal pressure of the packing; and said photo mask is held in said first position and second position, respectively, by expanding or contracting the packing.

* * * * *